United States Patent [19]

Gross

[11] Patent Number: 4,994,694

[45] Date of Patent: Feb. 19, 1991

[54] COMPLEMENTARY COMPOSITE PNP TRANSISTOR

[75] Inventor: Winthrop A. Gross, Portland, Oreg.

[73] Assignee: Tektronix, Inc., Beaverton, Oreg.

[21] Appl. No.: 397,213

[22] Filed: Aug. 23, 1989

[51] Int. Cl.[5] .......................................... H03K 17/60
[52] U.S. Cl. .................................. 307/570; 307/491; 307/495
[58] Field of Search ................ 307/446, 441, 491, 495

[56] References Cited

U.S. PATENT DOCUMENTS

| | | | |
|---|---|---|---|
| 3,531,656 | 9/1970 | Ammann | 307/495 |
| 4,480,201 | 10/1984 | Jaeschke | 307/570 |
| 4,636,665 | 1/1987 | McLaughlin | 307/491 |
| 4,730,124 | 3/1988 | Metz | 307/255 |
| 4,866,313 | 9/1989 | Tabata et al. | 307/570 |
| 4,868,421 | 9/1989 | Herndon et al. | 307/570 |
| 4,902,921 | 2/1990 | Hiramoto et al. | 307/570 |
| 4,916,338 | 4/1990 | Metz | 307/495 |

FOREIGN PATENT DOCUMENTS

| | | | |
|---|---|---|---|
| 1927873 | 12/1970 | Fed. Rep. of Germany | 307/446 |
| 0016726 | 1/1985 | Japan | 307/570 |
| 0105522 | 5/1987 | Japan | 307/570 |
| 0182913 | 7/1988 | Japan | 307/446 |
| 0246027 | 8/1988 | Japan | 307/570 |
| 0232520 | 9/1988 | Japan | 307/570 |

OTHER PUBLICATIONS

Soussi, Electron. & Appl. Ind. (France), No. 281, 3-1-5-80.

*Primary Examiner*—Stanley D. Miller
*Assistant Examiner*—T. Cunningham
*Attorney, Agent, or Firm*—Peter J. Meza

[57] ABSTRACT

A complementary composite PNP transistor includes a p-channel JFET and an operational amplifier coupled to form an ideal PNP transistor. The positive input of the operational amplifier forms the base of the composite transistor and the drain of the JFET forms the collector of the composite transistor. The anode of a diode-connected NPN transistor forms the emitter of the composite transistor, while the cathode is coupled to the source of the JFET. The diode-connected transistor provides complementary current-voltage characteristics for the composite PNP transistor since the saturation current and $g_m$ of the composite transistor are equal to that of an NPN transistor.

3 Claims, 1 Drawing Sheet

COMPLEMENTARY COMPOSITE PNP TRANSISTOR

BACKGROUND OF THE INVENTION

The present invention relates to composite PNP transistors, and more particularly to composite transistors using NPN transistors and p-channel junction field effect transistors.

Standard bipolar integrated circuit processes provide high speed vertical NPN transistors that are fabricated by diffusing a p-type base region into an n-type epitaxial layer and subsequently diffusing an n-type emitter region into the p-type base region. However, the standard bipolar integrated circuit process usually provides only low speed lateral PNP transistors wherein the n-type base region is formed by lithographic means or low speed substrate PNP transistors wherein the collector is the p-type substrate. Although these low speed transistors are deemed to be "complementary" to the vertical NPN transistors because they may used together in certain limited design configurations, they are not strictly complementary to the NPN transistors in the sense that the saturation current, $I_S$, of the emitter base junction of the transistors is not equal. Therefore, there are disparities in the current-voltage characteristics between the PNP and NPN transistors making it impossible to use certain desirable complementary design configurations.

Some bipolar integrated circuits provide a p-channel JFET (junction field effect transistor) that, while not having the frequency performance of the vertical NPN transistor, is far superior to the lateral PNP transistor. However, these devices are also not complementary because the saturation current and current-voltage characteristics differ from the vertical NPN transistor. Therefore what is desired is a composite PNP transistor that maintains the high speed of the JFET yet is complementary to the current-voltage characteristics of the vertical NPN transistor.

SUMMARY OF THE INVENTION

In accordance with the present invention, a complementary composite PNP transistor includes a p-channel JFET and an operational amplifier coupled to form an ideal PNP transistor. The positive input of the operational amplifier forms the base of the composite transistor and the drain of the JFET forms the collector of the composite transistor. The anode of a diode-connected NPN transistor forms the emitter of the composite transistor, while the cathode is coupled to the source of the JFET. The diode-connected NPN transistor provides complementary current-voltage characteristics for the composite PNP transistor since the saturation current and $g_m$ of the composite transistor are equal to that of an NPN transistor.

It is therefore an object of the present invention to provide a high speed composite PNP transistor having complementary current-voltage characteristics to an NPN transistor.

DESCRIPTION OF THE PREFERRED EMBODIMENT

Figure 1:
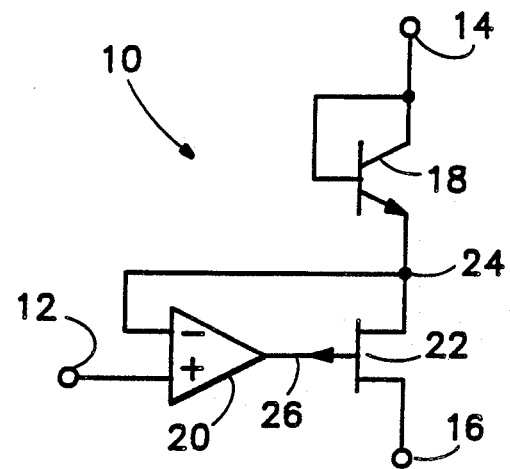
FIG. 1 is a schematic diagram of a complementary composite PNP transistor in accordance with the present invention.

Referring now to FIG. 1, a complementary composite PNP transistor 10 includes a base terminal 12, an emitter terminal 14, and a collector terminal 16. Active components include an operational amplifier 20, a diode connected NPN transistor 18, and a p-channel JFET 22. The diode connected NPN transistor 10 has an anode coupled to the emitter terminal 14 and a cathode coupled to terminal 24. The p-channel JFET is configured such that the source is coupled to terminal 24, the gate is coupled to connecting wire 26, and the drain is coupled to the collector terminal 16. The operational amplifier 20 has a positive input coupled to the base terminal 12, a negative input coupled to terminal 24, and an output coupled to connecting wire 26.

Amplifier 20 controls the gate voltage of p-channel JFET 22 such that the source voltage at terminal 24 is equal to the voltage at base terminal 12. As is well known in the art, the accuracy of the voltage following action at terminal 24 is dependent upon the open loop gain of amplifier 20. This configuration of amplifier 20 and p-channel JFET produces an "ideal" PNP transistor wherein terminal 24 is the emitter, and current flows from emitter to collector as in a normal PNP device. However, the ideal PNP transistor has no base to emitter voltage. Therefore, the addition of diode-connected NPN transistor 18 provides the voltage between the emitter terminal 14 and the base terminal 12 to be equal to that of a normal PNP device. The emitter base voltage is determined by the $I_S$ of transistor 18 and the current flowing therethrough. If the voltage gain of amplifier 20 is large, the effective $I_S$ of the composite PNP transistor 10 is equal to the $I_S$ of NPN transistor 18. In addition, the $g_m$, or transconductance, of the composite PNP transistor 10 is equal to the transconductance of an NPN transistor operating at the same current.

Figure 2:
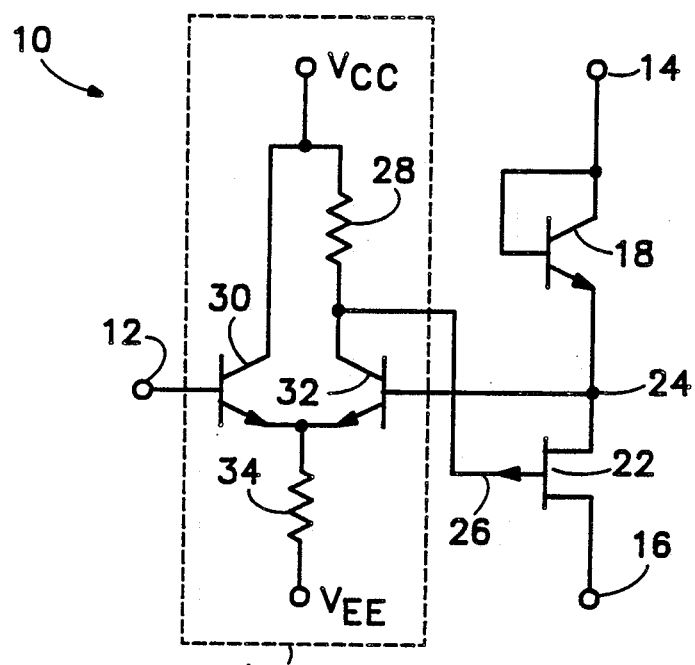
FIG. 2 is a schematic diagram of an integratable embodiment of the complementary composite PNP transistor in accordance with the present invention.

An alternative embodiment that may be realized in an integrated circuit is shown in FIG. 2. In this embodiment the operational amplifier 20 has been replaced by a differential amplifier 20' including a pair of NPN transistors 30 and 32. The emitters of transistors 30 and 32 are coupled together and to a source of constant current produced by resistor 34. The base of the transistor 30 forms the base terminal 12, the base of transistor 32 is coupled to the source of p-channel JFET 22, and the collector of transistor 32 is coupled to the gate of p-channel JFET 22. A load resistor 28 provides the gain for amplifier 20'.

It is important to note that the embodiment shown in FIG. 2 preserves the desirable high speed characteristics of the p-channel JFET 22 since transistors 30 and 32 are high speed NPN transistors and resistors 28 and 34 represent the minimum number of circuit components necessary to realize the amplifier function, reducing parasitic capacitance.

Other embodiments are possible for the differential amplifier 20' wherein resistor 34 is replaced by a transistor current source, and load resistor 28 is replaced by an active transistor load. In addition, more sophisticated amplifiers may be used, but at the expense of additional power consumption and circuit size.

While I have shown and described the preferred embodiment of my invention, it will be apparent to those skilled in the art that many changes and modifications may be made without departing from the invention in its broader aspects.

I claim:

1. A complementary composite PNP transistor comprising:
   (a) a collector terminal, a base terminal, and an emitter terminal;
   (b) a p-channel JFET having a gate, a source, and a drain coupled to the collector terminal;
   (c) diode means having an anode coupled to the emitter terminal and a cathode coupled to the source of the p-channel JFET; and
   (d) amplifier means having a positive input, a negative input, and an output, the positive input being coupled to the base terminal, the negative input being coupled to the source of the p-channel JFET, and the output being coupled to the gate of the p-channel JFET.

2. A complementary composite PNP transistor as in claim 1 wherein the diode means is an NPN transistor having a coupled base and collector that forms the anode and an emitter that forms the cathode.

3. A complementary composite PNP transistor as in claim 1 wherein the amplifier means comprises first and second transistors, each transistor having a base, a collector, and an emitter, the emitters being coupled together and to a source of constant current, the collector of the first transistor being coupled to a bias source, the base of the first transistor forming the base terminal, the base of the second transistor being coupled to the source of the p-channel JFET, and the collector of the second transistor being coupled to the gate of the p-channel JFET and to a load means.

* * * * *